United States Patent [19]

Ichihara

[11] Patent Number: 4,851,978
[45] Date of Patent: Jul. 25, 1989

[54] ILLUMINATION DEVICE USING A LASER

[75] Inventor: Yutaka Ichihara, Yokohama, Japan

[73] Assignee: Nikon Corporation, Tokyo, Japan

[21] Appl. No.: 135,378

[22] Filed: Dec. 21, 1987

[30] Foreign Application Priority Data

Dec. 24, 1986 [JP] Japan .................. 61-306360

[51] Int. Cl.$^4$ ................ G03B 27/00; G02B 27/48
[52] U.S. Cl. .................. 362/268; 350/167;
350/576; 350/66; 355/67; 362/259
[58] Field of Search .......... 350/6.6, 167, 576, 574;
355/67, 71; 362/288, 259; 353/122

[56] References Cited

U.S. PATENT DOCUMENTS

| | | | |
|---|---|---|---|
| 4,450,358 | 5/1984 | Reynolds | 250/492.1 |
| 4,458,994 | 7/1984 | Jain et al. | 354/4 |
| 4,497,015 | 1/1985 | Konno et al. | 350/167 |
| 4,498,009 | 2/1985 | Reynolds | 250/492.1 |
| 4,619,508 | 1/1986 | Shibuya et al. | 353/122 |
| 4,683,524 | 7/1987 | Ohta | 362/268 |
| 4,717,242 | 1/1988 | Echizen et al. | 362/268 |
| 4,782,368 | 11/1988 | Ogawa et al. | 355/43 |

FOREIGN PATENT DOCUMENTS 160134  9/1984  Japan .................. 355/71

Primary Examiner—Jon W. Henry
Attorney, Agent, or Firm—Shapiro and Shapiro

[57] ABSTRACT

An illumination device forms a secondary light source having N spots by vibrating a laser beam having a wavelength $\lambda$ emitted from a pulsed laser by a vibration mirror having a swing angle $\theta_0$, and irradiates an object to be illuminated through a plurality of lens elements arranged at a spacing d. Those elements meet relations of $$d = m.(\lambda/\theta_0)$$

$$N.(\lambda/\theta_0) > M.d$$

where M is the number of lens elements in a predetermined array direction of the plurality of lens elements included in at least a spatial coherent area and m is any integer. Light intensity of the pulsed laser illumination is adjusted such that a total light intensity of the laser beam having pulses satisfying the above relations is equal to a light intensity required for the object to be illuminated.

5 Claims, 4 Drawing Sheets $\theta_{0a}$ $\theta_{0b} = 3\theta_{0a}$

ILLUMINATION DEVICE USING A LASER

BACKGROUND OF THE INVENTION

1. Field of the Invention

The present invention relates to an illumination device which uses a laser as a light source, and more particularly to an illumination device suitable for an exposure device used in the fabrication of an integrated circuit.

2. Related Background Art

As a light source of the exposure device used in the fabrication of integrated circuits, an ultra-high pressure mercury vapor lamp has been mainly used in the past.

Recently, integration density of the integrated circuit has been increasing rapidly and a higher line width accuracy is required.

Accordingly, instead of the ultra-high pressure mercury vapor lamp, a short wavelength, high power laser such as an excimer laser is used as a light source of the exposure device.

However, when a narrow wavelength band laser is used, such as one which uses injection locking, speckle is generated by interference, and formation of a fine pattern is impeded.

In order to prevent the generation of speckle, an illumination device as shown in FIG. 2 has been used in the past.

In FIG. 2, a laser beam LB emitted from a laser light source 10 passes through lenses 12 and 14 and is directed to a deflection mirror or vibration mirror 16 where it is deflected, and then passes through a lens 18 and forms a spot at a position PA.

The laser beam LB focused by a condenser lens 20, is directed to a reticle R, passes therethrough and is applied to a projection optical system 22 which is telecentric on both an object side and an image side.

The projection optical system 22 has a front group of projection lenses 22A and a rear group of projection lenses 22B. The laser beam LB which has passed through the projection optical system 22 is directed to a wafer W. Thus, a circuit pattern on the reticle R is projected onto the wafer W.

The illumination device will now be explained in further detail. The laser beam LB is expanded in diameter by the lenses 12 and 14 and directed to the vibration mirror 16. The vibration mirror 16 is vibrated around a rotation axis, as shown by an arrow, during the exposure so that an expanded secondary light source is formed at the position PA.

The image of the secondary light source is focused to a pupil position 22P in the projection optical system 22 by the condenser lens 20 and the front group of projection lenses 22A in the projection optical system 22.

Since the light from the respective focus points of the secondary light source is considered to be incoherent, no speckle should be generated on the wafer W.

However, in the prior art illumination device, light intensity distribution on the reticle R and the wafer W is not uniform but is a gaussian distribution or close thereto.

In accordance with an illumination optical arrangement disclosed in U.S. Pat. No. 4,619,508 assigned to the assignee of the present invention, in order to secure uniformity of the light intensity distribution, a collimator lens and a flyeye lens (not shown) are inserted between the secondary light source at the position PA and the condenser lens 20, and the light source images by the flyeye lens are focused to the pupil position 22P of the projection optical system 22.

However, the light at the pupil position 22P does not exhibit sufficient in coherency even if the vibration mirror 16 is vibrated, and interference generates speckle on the wafer W.

SUMMARY OF THE INVENTION

It is an object of the present invention to provide an illumination device which resolves the above problems and provides a uniform intensity by a laser beam without speckle.

In accordance with the present invention, the above object is achieved by determining an intensity distribution (or size of a light source image) of a secondary light source formed by vibrating a laser beam of a pulsed laser, providing an arrangement of lens elements included in at least a spatial coherent area, selecting a wavelength of the laser beam, and by adjusting the illumination intensity to that required by an object to be illuminated.

In accordance with the present invention, the lens elements are arranged to meet $$d = m \cdot (\lambda/\theta_0)$$

$$N \cdot (\lambda/\theta_0) > M \cdot d$$

where $\lambda$ is the wavelength of the pulsed laser, $\theta_0$ is an angle (referred to as "a swing angle" hereafter) representing the range of variation of the incidence angle of a laser beam incident on a flyeye lens (the variation caused by vibration of a mirror), N is the number of spots (in one-dimensional array) of the secondary light source formed by the vibration mirror, d is a spacing between lens elements, M is the number of lens elements linearly arranged in at least the spatial coherent area, and m is any integer. Light intensity adjusting means is provided to adjust the light intensity of the pulsed laser to the object to be illuminated such that the total light intensity of the laser beam reaches the light intensity required by the object to be illuminated.

In accordance with the present invention, since the lenses included in at least the spatial coherent area are arranged at positions to render a Fourier transformation of the intensity distribution of the secondary light source to zero, there is no substantial interference among the laser beams passing through those lens elements according to a Van Cittert-Zernike theory.

The overall illumination intensity is adjusted by the light intensity adjusting means so that necessary intensity of illumination light is applied to the object to be illuminated.

DESCRIPTION OF THE PREFERRED EMBODIMENTS

An embodiment of the present invention will now be explained with reference to the drawings in which like elements to those of the prior art device are designated by like numerals.

Figure 1:
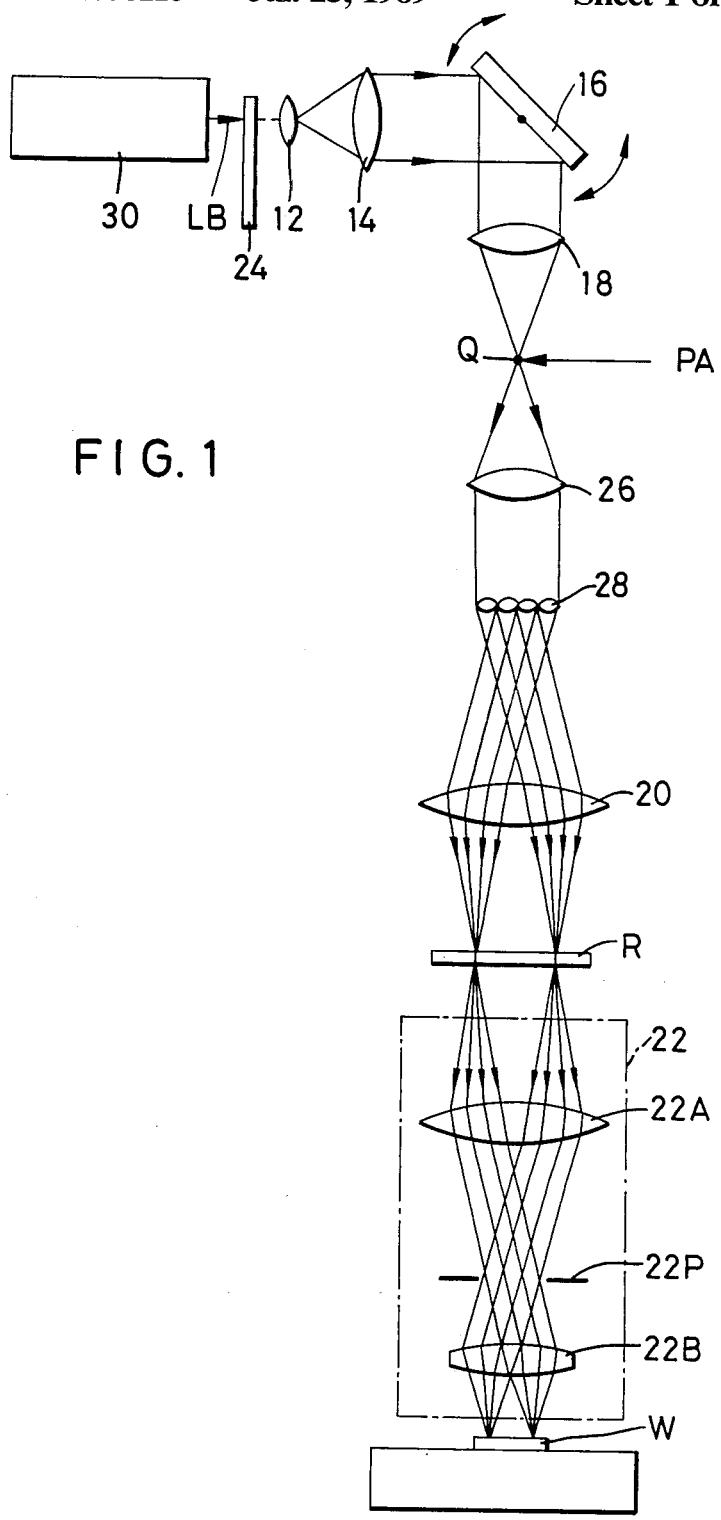
FIG. 1 shows an optical arrangement in one embodiment of the present invention.
Figure 2:
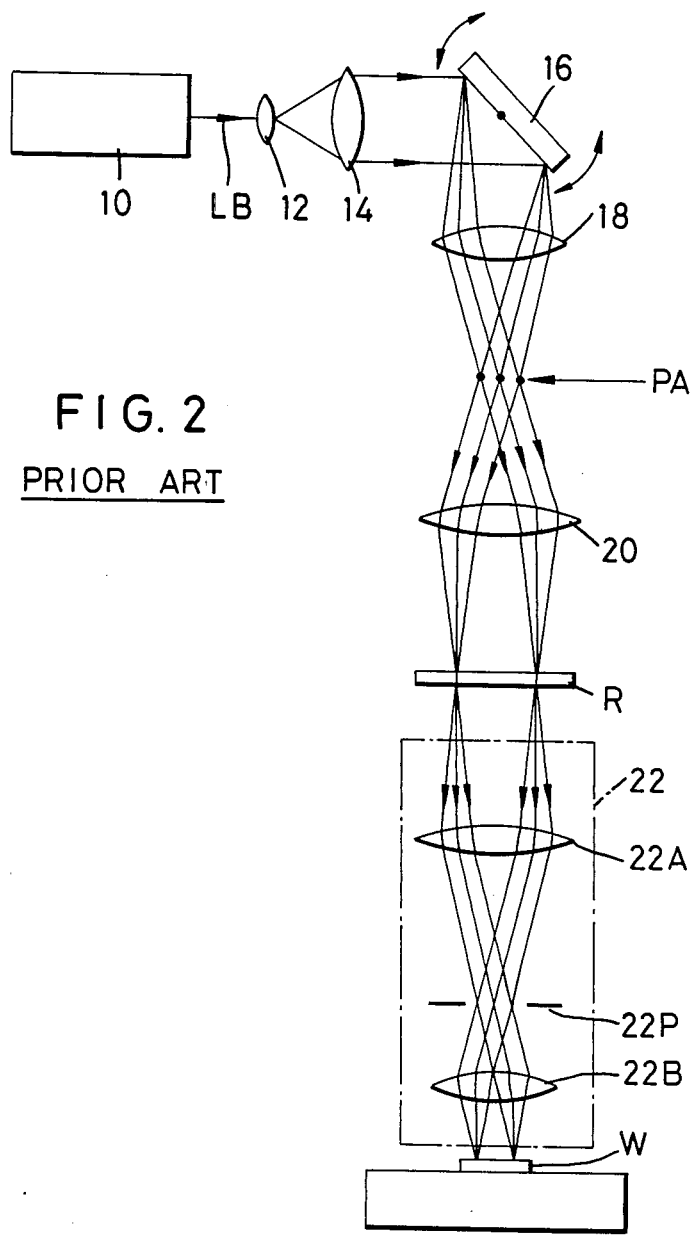
FIG. 2 shows an optical arrangement in a prior art device.

FIG. 1 shows an embodiment of the illumination device of the present invention. A pulsed laser beam LB which is periodically generated by a pulsed laser light source 30 such as an excimer laser passes through a filter 24 and lenses 12 and 14 and is directed to a vibration mirror 16.

The laser beam LB having its optical axis deflected by the vibration mirror 16 passes through a lens 18 and is directed to a collimator lens 26. The collimated laser beam LB is then directed to a flyeye lens 28 having a plurality of lens elements.

The laser beam LB which has passed through the flyeye lens 28 is focused on a reticle R by a condenser lens 20 so that a projection image of a circuit pattern of the reticle R is formed on a wafer W by a projection optical system 22.

Speckle would normally be generated as described earlier. However, by properly adjusting the intensity distribution of the secondary light source Q determined by the number of exposure pulses of the laser beam LB and the swing angle, and by virtue of the arrangement of the lens elements of the flyeye lens 28, the speckle may be reduced and the light intensity distribution made uniform.

The required conditions in the present embodiment will now be explained in detail.

According to the Van Cittert-Zernike theory, a conjugate coherent coefficient which represents a degree of light coherency between two points is given by a Fourier Transformation of the light intensity distribution of the light source.

In the present embodiment, the secondary light source Q is formed at the position PA.

The light intensity distributions of the secondary light source Q when viewed from the flyeye lens 28 and their Fourier transformations are shown in FIGS. 3 to 7.

FIGS. 3A to 7A show intensity distributions of the secondary light source Q, and FIGS. 3B to 7B show their Fourier transformations.

While one-dimensional models are shown, it is easy to expand them to two-dimensional models.

Figure 3A:
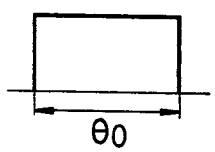
FIGS. 3A, 4A, 5A, 6A and 7A show light intensity distributions of secondary light sources.
Figure 3B:
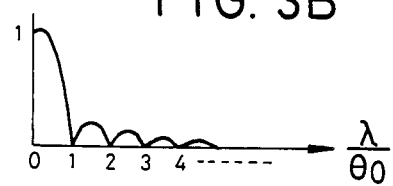
FIGS. 3B, 4B, 5B, 6B and 7B show relations of Fourier Transformations for the intensity distributions of FIGS. 3A, 4A, 5A, 6A and 7A, respectively.
Figure 4A:
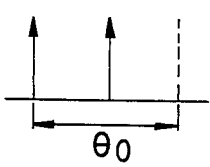
Figure 4B:
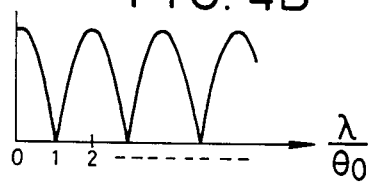
Figure 5A:
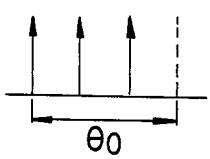
Figure 5B:
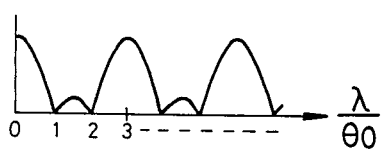
Figure 6A:
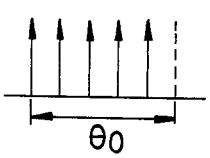
Figure 6B:
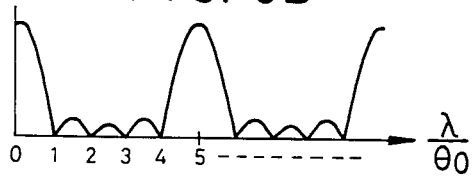
Figure 7A:
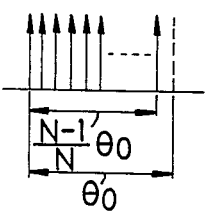
Figure 7B:
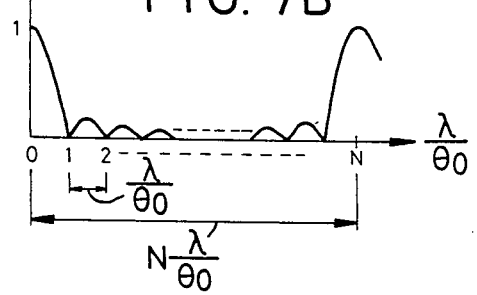

In FIGS. 3A and 3B, the intensity distribution of the secondary light source Q is uniform, and in FIGS. 4A to 7A and 4B to 7B, the intensity distribution of the secondary light source Q is discrete. For example, when a pulsed laser is used as the light source, the intensity distribution is discrete. In those figures, $\theta_0$ represents a swing angle corresponding to the distribution width of the secondary light source Q, and vertical arrows shown in FIGS. 4A to 7A represent the generation of the pulsed laser light. It is necessary to eliminate the pulse lastly generated in the range of swing angle $\theta_0$.

As seen from FIGS. 4B to 7B, there are $N-1$ zero points at a constant interval $(\lambda/\theta_0)$ on a Fourier plane or a plane of the flyeye lens for N secondary light source spots of the constant interval $(\theta_0/N)$, where $\lambda$ is a wavelength of the laser beam LB.

At the positions of zero points, the conjugate coherence coefficients are zero by the Van Cittert-Zernike theory.

Accordingly, by arranging no more than N lenses for N spots of the secondary light source Q at the spacing $d(=\lambda/\theta_0)$, the laser beams LB which have passed through the respective lenses do not interfere with each other.

If the spacing d of the lens elements of the flyeye lens 28 is given, the laser beam LB should be vibrated with a corresponding swing angle $\theta_0$.

In summary, uniform illumination without speckle is attained when the relation $$d = \lambda/\theta_0 \qquad (1)$$

is met, where $\lambda$ is the wavelength of the laser beam LB, $\theta_0$ is the swing angle and d is the spacing in the one-dimensional direction of the lens elements of the flyeye lens 28.

As will be explained later, the formula (1) may be expanded to $$d = m \cdot (\lambda/\theta_0) \qquad (2)$$

where m is any integer.

Figure 8:
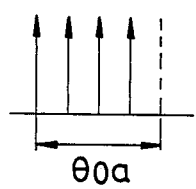
FIG. 8 shows a light intensity distribution of the secondary light source when N=4.
Figure 9:
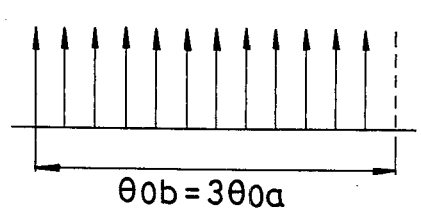
FIG. 9 shows a light intensity distribution of the secondary light source when N=12.
Figure 10:
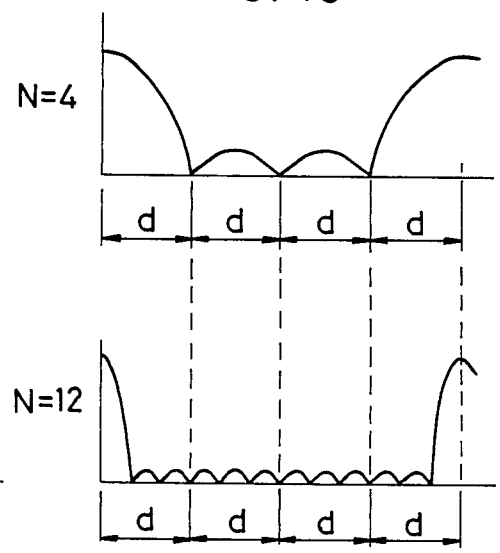
FIG. 10 shows relation of Fourier transformation for the light intensity distributions of FIGS. 8 and 9.

FIG. 8 shows an intensity distribution when the number N of spots of the secondary light source Q is 4, and FIG. 9 shows an intensity distribution when $N=12$. FIG. 10 shows Fourier transformations thereof.

As seen from FIG. 10, the zero points appear at the interval d although the interval of zero points varies with the Fourier plane.

A relation $$d = \lambda/\theta_{0a} = 3\lambda/\theta_{0b}$$

is met, where $\theta_{0a}$ is a swing angle in FIG. 8 and $\theta_{0b}$ is a swing angle in FIG. 9. In general, the above formula is valid for any integer m.

The non-interference condition of the laser beams LB will now be explained in further detail.

A relation $$N(\lambda/\theta_0) > M \cdot d \qquad (3)$$

should be met, where M is the number of lens elements, in a predetermined direction, of the flyeye lens 28 having the lens spacing d.

From the formulas (2) and (3), $$\theta_0 = (m \cdot \lambda)/d \qquad (4)$$

$$\theta_0/N < \lambda/M \cdot d = \theta_0/m \cdot M \qquad (5)$$

$$N > m \cdot M \qquad (6)$$

Accordingly, a maximum swing angle is given by $$[(N-1)/N] \cdot \theta_0 = m[(N-1)/N] \cdot \lambda/d \qquad (7)$$

Swing angle for the spot interval of the secondary light source Q is given by $$\theta_0/N < \lambda/(M \cdot d) \qquad (8)$$

A final swing angle is corrected by magnifications of the lens 18 and the collimator lens 26. Namely, the swing angle is set to be $f_b/f_a$ times as large as the swing angle of the incident light beam to the flyeye lens 28, where fa and fb are focal distances of the lens 18 and the collimator lens 26, respectively.

In this manner, the speckle of the laser beam LB can be substantially eliminated by properly selecting the number of spots and the distribution width of the secondary light source for the wavelength λ of the laser beam LB, and the number of lens elements and lens spacing thereof in the flyeye lens 28.

However, in actual exposure work of the wafer W, the number of exposure pulses or the number N of spots of the secondary light source Q cannot be arbitrarily determined because the number E of exposure pulses is determined in balance to a sensitivity of a resist layer formed on the wafer W, that is, by an optimum exposure intensity.

The number E of exposure pulses is given by $I_o/I_p$, where $I_o$ is the optimum exposure intensity and $I_p$ is an exposure intensity per pulse of the laser beam LB.

It must be equal to an integer multiple of the number N of spots of the secondary light source Q. Namely, $$E = n.N = I_o/I_p \quad (9)$$

On the other hand, the flyeye lens 28 of the exposure device has $M_x \times M_y$ lens elements arranged at a constant pitch in orthogonal directions in order to project a two-dimension plane pattern. The lens elements $M_x$ are arranged in the x direction and $M_y$ in the y direction. Normally, $M_x = M_y$.

The number E of exposure pulses must be larger than $M_x \times M_y$, from the condition of the formula (6).

$$I_o/I_p > M_x.M_y \quad (10)$$

For example, when $M_x = M_y = 10$, the number of exposure pulses must be larger than 100.

In order to meet the above condition, the exposure intensity $I_p$ per pulse of the laser beam LB is measured before-hand. If the condition is not met, the exposure intensity $I_p$ per pulse is reduced by inserting the filter 24 or adjusting a power supply (not shown) of the laser light source 10 so that the above condition is met.

When the number of spots of secondary light source in the directions of arrangement of the flyeye lens 28 is given by $S_x \times S_y$, $I_o/I_p$ must be an integer multiple of $S_x \times S_y$ and $$S_x > m_x.M_x \quad (11)$$

$$S_y > m_y.M_y \quad (12)$$

must be met, where $m_x$ and $m_y$ are integers.

Since $M_x = M_y$ usually, a value which is closest to $(I_o/I_p)^{\frac{1}{2}}$ and larger than $M_x$ is selected as the number $S_x$ of spots of the secondary light source Q.

$S_y$ which meets $$S_x(S_y - 1) < I_o/I_p \leq S_x.S_y \quad (13)$$

is determined.
Since $$I_o/I_p \leq S_x.S_y \quad (14)$$

$I_p$ is reduced in the method described above so that $$I_o/I_p = S_x.S_y \quad (15)$$

is met.

$I_p$ (and $I_o$) which are bases of the above calculation are derived from $I_p$ monitored in the exposure operation.

In this manner, the conditions of the components are determined.

The operation of the embodiment will now be explained. As described above, the intensity of the laser beam LB emitted from the laser light source 10 is adjusted by the filter 24 for the exposure intensity $I_p$ per pulse based on the optimum exposure $I_o$.

The beam diameter of the laser beam LB is expanded by the lenses 12 and 14, and it is applied to the vibration mirror 16, which vibrates at the swing angle $\theta_0$ which meets the conditions shown in the formulas (1) to (3) to swing the laser beam LB.

Since the laser beam LB passes through the collimator lens 26 and the flyeye lens 28, the laser beam is uniformly distributed on the recticle R.

Since the number of spots and the distribution width of the secondary light source Q, and the number of lens elements and the spacing thereof of the flyeye lens 28 are set in the manner described above, the laser beams LB transmitted through the lens elements of the flyeye lens 28 do not interfere to generate speckle.

The present invention is not limited to the above embodiment. For example, the numbers of two-dimensional array lens elements of the flyeye lens need not be equal in the orthogonal directions; they may be different.

Actually, the coherency (spatial coherency) of the laser light source (for example, excimer laser) is not high enough to permit the application of the above formula. It is not the light transmitted through the entire flyeye lens but only the laser beams transmitted through several lens elements around each lens element that interferes with the laser beam transmitted through each lens element.

Accordingly, in the above embodiment, when the number of lens elements included in the spatial coherent area on the flyeye lens plane is used instead of the number $M_x \times M_y$ of all lens elements of the flyeye lens, a practically sufficient effect is attained.

Specifically, a smallest integer which is larger than l/d (where l is a spatial coherent distance and d is a spacing of the lens elements of the flyeye lens) may be used instead of $M_x \times M_y$.

While an above embodiment relates to the exposure devices, the present invention may be applied to other device.

I claim:

1. An illumination device for illuminating an object with light from a pulsed laser beam light source of wavelength λ that is directed toward said object by a vibration mirror, the vibration of which forms, from said pulsed laser beam, a secondary light source having N spots, comprising an array of M lens elements between said secondary light source and said object, said lens elements being arranged at a spacing d along one dimension of the array and disposed at a spatial coherent area of light from said secondary light source, said device meeting the following conditions:

$$d = m.(\lambda/\theta_o)$$

$$N.(\lambda/\theta_o) > M.d$$

where m is an integer and $\theta_o$ is an angle representing the range of variation of the angle of incidence of said light from said secondary light source incident on said lens elements, and means for adjusting the intensity of light illuminating said object such that the total light intensity of pulses of light emitted by said pulsed laser light source is substantially equal to a light intensity required by said object.

2. An illumination device in accordance with claim 1, wherein said array of lens elements is replicated in two dimensions to form a flyeye lens.

3. An illumination device in accordance with claim 1, wherein said pulsed laser light source comprises an excimer laser.

4. An illumination device in accordance with claim 1, wherein said light intensity adjusting means comprises a filter in the path of said laser beam.

5. An illumination device in accordance with claim 1, further comprising means for collimating light from said secondary light source which is incident upon said array of lens elements.

* * * * *